United States Patent
Kang

(10) Patent No.: US 6,989,703 B2
(45) Date of Patent: Jan. 24, 2006

(54) SHARED DELAY CIRCUIT OF A SEMICONDUCTOR DEVICE

(75) Inventor: Sang Hee Kang, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/673,014

(22) Filed: Sep. 26, 2003

(65) Prior Publication Data
US 2004/0251945 A1 Dec. 16, 2004

(30) Foreign Application Priority Data
Jun. 16, 2003 (KR) ............. 10-2003-0038747

(51) Int. Cl.
*H03H 11/26* (2006.01)

(52) U.S. Cl. .................................... 327/261
(58) Field of Classification Search ........ 327/100–103, 327/161, 261–264, 276–278, 293, 295–296, 327/294, 298
See application file for complete search history.

(56) References Cited

U.S. PATENT DOCUMENTS

| | | | | |
|---|---|---|---|---|
| 3,760,109 A | * | 9/1973 | Kogo et al. ............ | 370/479 |
| 3,919,683 A | * | 11/1975 | Itamura et al. ......... | 367/105 |
| 4,159,528 A | * | 6/1979 | Perry ................... | 708/403 |
| 5,185,540 A | * | 2/1993 | Boudry ................. | 327/276 |
| 5,490,126 A | * | 2/1996 | Furumiya et al. ...... | 369/59.12 |
| 5,745,467 A | * | 4/1998 | Sakaue et al. ......... | 369/59.11 |

* cited by examiner

*Primary Examiner*—My-Trang Nu Ton
(74) *Attorney, Agent, or Firm*—Ladas & Parry LLP

(57) ABSTRACT

A shared delay circuit of a semiconductor device can share a plurality of delay elements having the same function by integrating the delay elements. The shared delay circuit includes an input signal conversion unit for converting a plurality of input signals into a plurality of pulse signals, a delay unit for delaying the pulse signals outputted from the input signal conversion unit for a predetermined time to output the delayed pulse signal, and a switch and output control unit for receiving the pulse signals outputted from the input signal conversion unit and the delayed pulse signals delayed for the predetermined time through the delay unit, and outputting the delayed pulse signals in the same form as the input signals inputted to the input signal conversion unit. According to the shared delay circuit, the repeated arrangement of circuits having the same function can be avoided by sharing the delay circuits in the semiconductor device and thus the installation area of the delay circuits can be reduced.

9 Claims, 10 Drawing Sheets

SHARED DELAY CIRCUIT OF A SEMICONDUCTOR DEVICE

BACKGROUND OF THE INVENTION

1. Field of the Invention

The present invention relates to a delay circuit used in a semiconductor device, and more particularly to a shared delay circuit of a semiconductor device which can share a plurality of delay elements having the same function by integrating the delay elements.

2. Description of the Prior Art

As generally known in the art, a semiconductor device has diverse kinds of delay circuits installed therein for the purpose of a buffer function, time delay, etc. Accordingly, in many cases, a plurality of delay circuits having the same time delay are provided in a semiconductor device.

FIG. 1 is a view illustrating the construction of a related art delay circuit which receives input signals and then outputs the signals after delaying them for a predetermined time. For reference, the respective delay circuits have the same delay time and the same function.

In FIG. 1, the reference numeral "PERI" denotes a peripheral area which provides input signals INPUT 0, INPUT 1, INPUT 2, and INPUT 3 to a circuit block, and "DELAY" denotes a delay circuit. Also, "BLOCK" denotes a circuit block having the same function in the semiconductor device.

FIG. 1 shows a case that the number of circuit blocks is 4, and the input signals INPUT 0, INPUT 1, INPUT 2, and INPUT 3 are inputted to respective circuit blocks BLOCK 0, BLOCK 1, BLOCK2 and BLOCK3, respectively.

In operation, the selection of the respective input signals and the circuit blocks is typically performed by a control signal (for example, address signal). In the case that an input signal corresponding to a specified circuit block is applied by the control signal, the input signal causes an output signal OUTPUT to be produced through a delay circuit in the circuit block, and this output signal is used in the corresponding circuit block. Generally, one of the input signals INPUT 0, INPUT 1, INPUT 2, and INPUT 3 is selected, but in a special case, two or more input signals may be simultaneously selected.

FIGS. 2A and 2B are views illustrating a signal flow of delay signals obtained by delaying the input signals for a predetermined time using the related art delay circuit illustrated in FIG. 1. Specifically, FIG. 2A illustrates a delay process of a level signal applied in the form of a high/low level, and FIG. 2B illustrates a delay process of a pulse signal. As illustrated, it can be recognized that the level signal or the pulse signal applied to the delay circuit is outputted, being delayed for a predetermined time.

In the related art, if there is a plurality of circuit blocks having the same function as shown in FIG. 1, it is general that the input signals INPUT 0, INPUT 1, INPUT 2, and INPUT 3 inputted to the respective circuit blocks pass through a plurality of separated paths even though they are signals for the same operation.

In this case, the delay circuits, which have the same constituent elements, i.e., a resistor and a capacitor, and which have the same time delay, are arranged in a repeated form for each circuit block, and this causes the area efficiency to deteriorate. Also, since the delay circuits are separately arranged in different locations, they may present different time delay characteristics due to a change of process, voltage and temperature.

SUMMARY OF THE INVENTION

Accordingly, the present invention has been made to solve the above-mentioned problems occurring in the related art, and an object of the present invention is to provide a delay circuit of a semiconductor device, in which a plurality of delay circuits having the same delay time and the same function are not arranged in a repeated form and which have the same delay characteristic.

In order to accomplish this object, there is provided a delay circuit of a semiconductor device which replaces a plurality of delay circuits having the same delay time and the same function with one shared delay circuit.

The shared delay circuit of a semiconductor device according to the present invention receives a plurality of input signals, and delays the plurality of input signals for a predetermined time using one shared delay circuit.

Also, the shared delay circuit of a semiconductor device according to the present invention converts an input signal into a pulse signal, delays the pulse signal for a predetermined time, and then converts the pulse signal in the same form as the input signal to output the converted pulse signal.

The shared delay circuit of a semiconductor device according to the present invention includes an input signal conversion unit for converting a plurality of input signals into a plurality of pulse signals, a delay unit for delaying the pulse signals outputted from the input signal conversion unit for a predetermined time to output the delayed pulse signal, and a switch and output control unit for receiving the pulse signals outputted from the input signal conversion unit and the delayed pulse signals delayed for the predetermined time through the delay unit, and outputting the delayed pulse signals in the same form as the input signals inputted to the input signal conversion unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
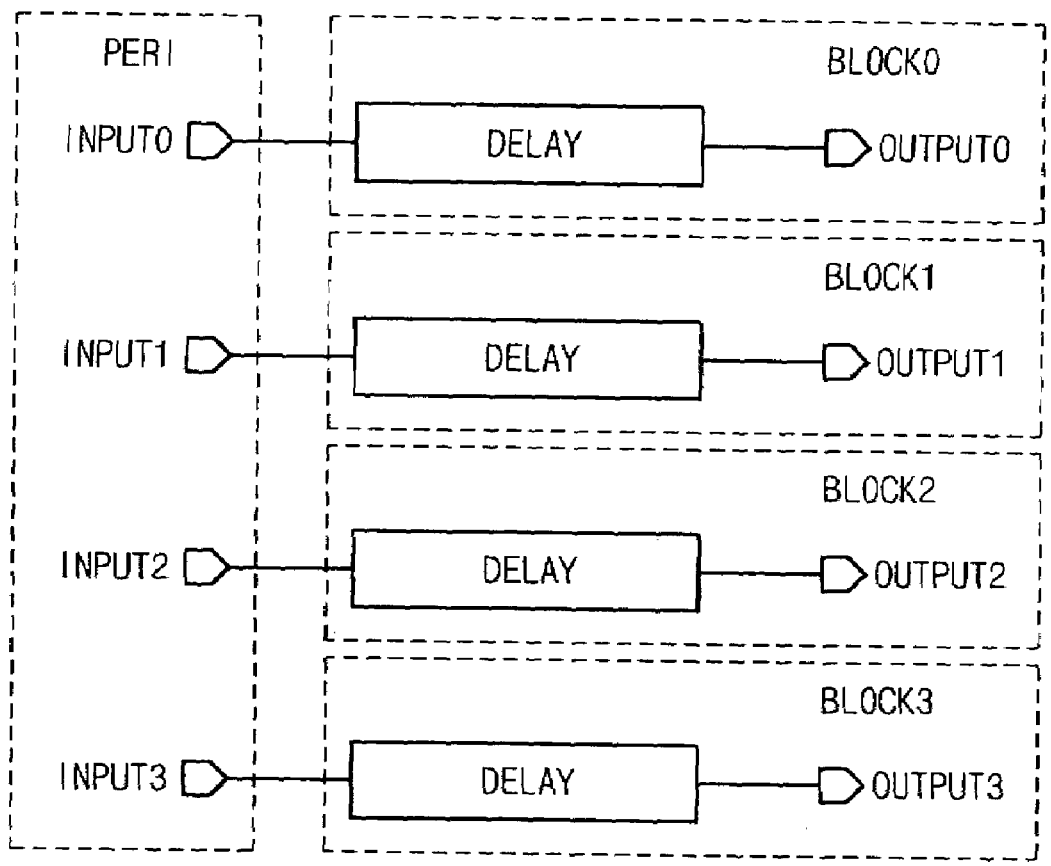
FIG. 1 is a view illustrating the construction of a related art delay circuit.
Figure 2A:
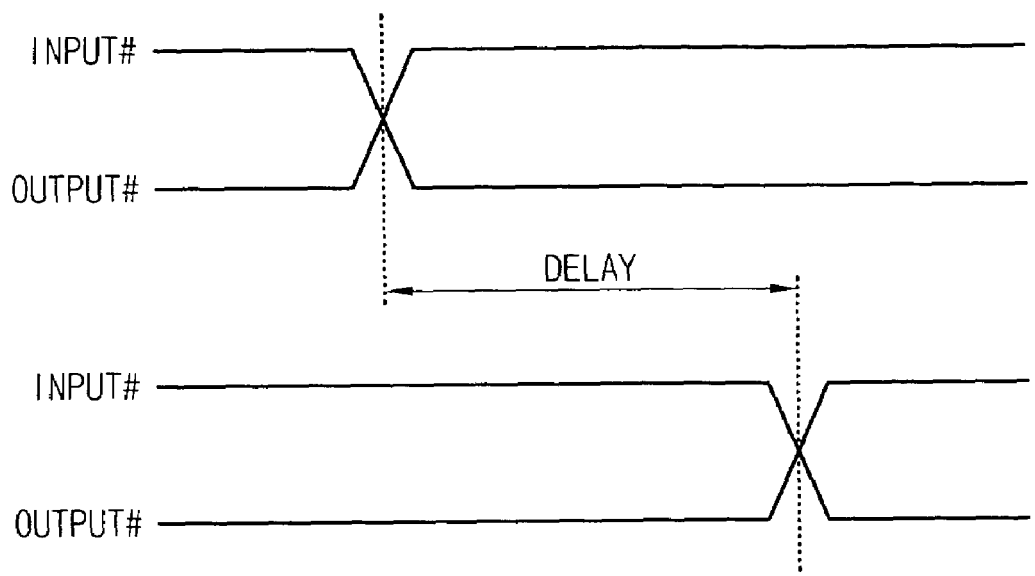
FIGS. 2A and 2B are views illustrating a signal flow of delay signals obtained by delaying input signals for a predetermined time using the related art delay circuit illustrated in FIG. 1.
Figure 2B:
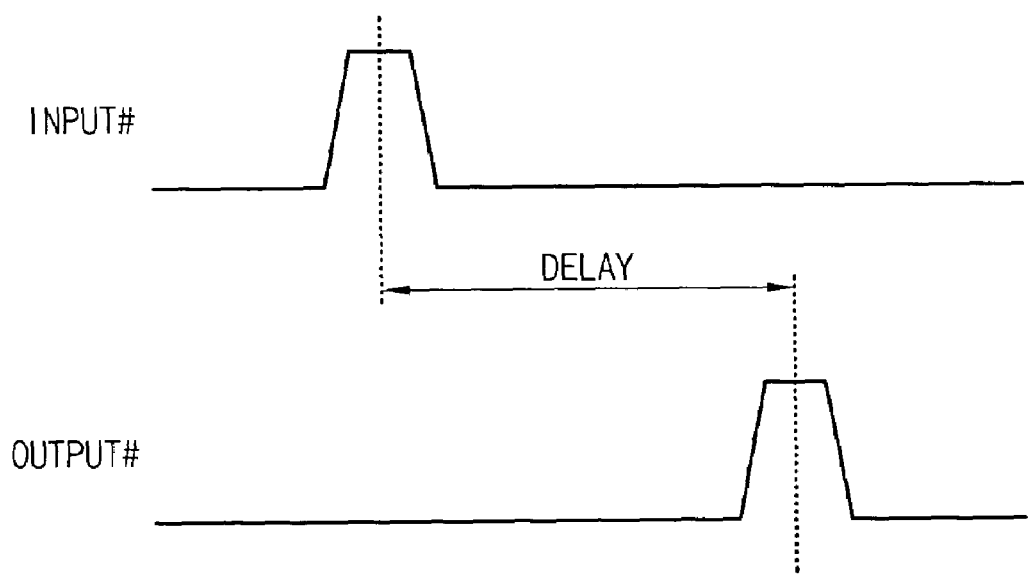

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
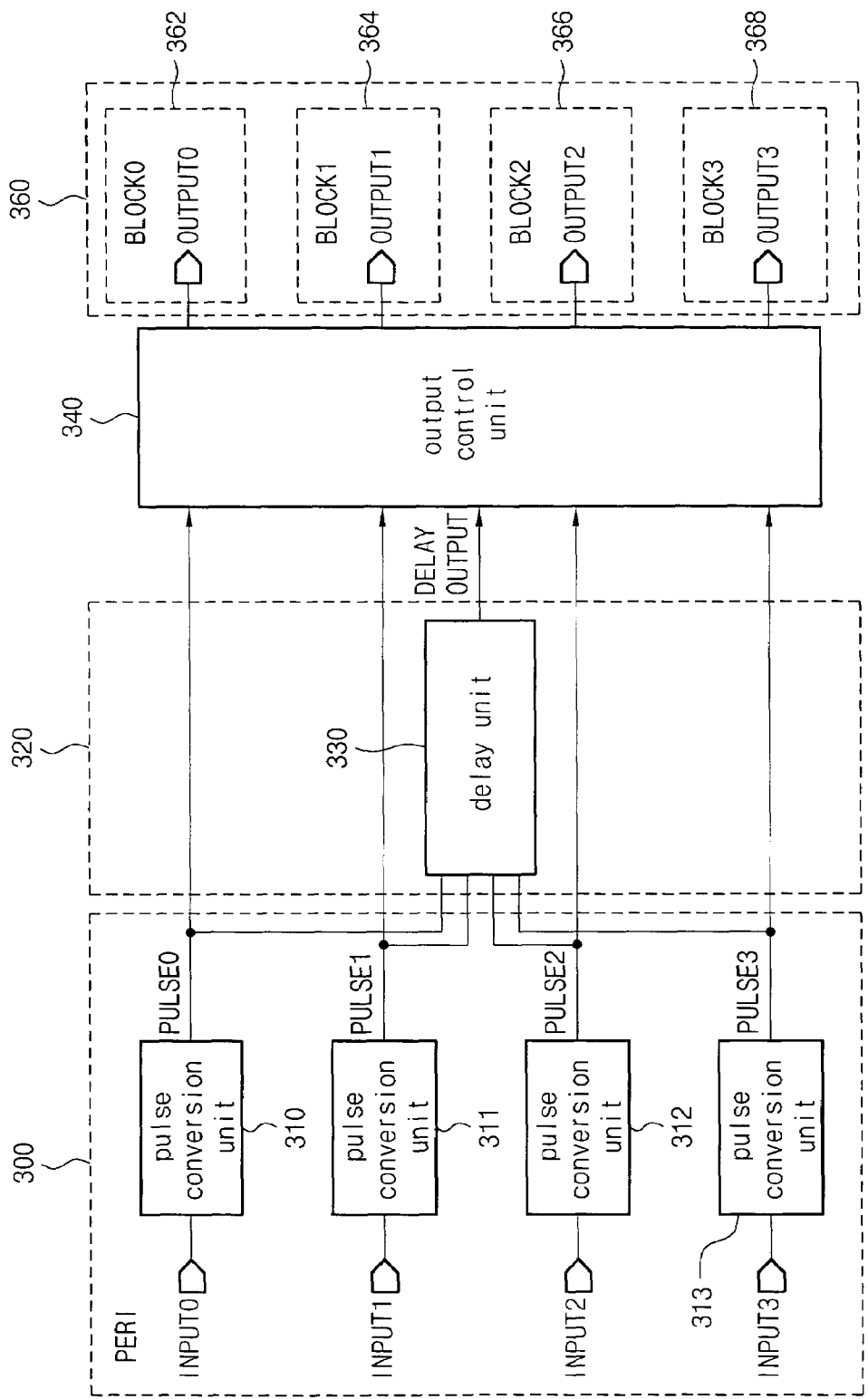
FIG. 3 is a circuit diagram of a shared delay circuit of a semiconductor device according to an embodiment of the present invention.

FIG. 3 is a circuit diagram of a shared delay circuit of a semiconductor device according to an embodiment of the present invention.

As shown in FIG. 3, the shared delay circuit of a semiconductor device according to the present invention includes an input signal conversion unit 300, a shared delay unit 320, and an output control unit 340. A circuit block unit 360 is a part which receives and uses the output signals of the output control unit 340.

In FIG. 3, the input signal conversion unit 300 is composed of a plurality of pulse conversion units 310, 311, 312 and 313 corresponding to a plurality of input signals INPUT 0, INPUT 1, INPUT 2 and INPUT 3. In the embodiment as illustrated in FIG. 3, it is assumed that the number of input signals is 4. The pulse conversion units 310, 311, 312 and 313 have the same circuit construction. Accordingly, it is also possible to replace them with one shared pulse conversion unit. The pulse conversion units 310, 311, 312 and 313 receive the corresponding input signals INPUT 0, INPUT 1, INPUT 2 and INPUT 3, and then convert them into pulse signals PULSE 0, PULSE 1, PULSE 2 and PULSE 3 to output the pulse signals.

FIGS. 4A to 4D are waveform diagrams of input signals applied to a pulse conversion unit and output signals of the pulse conversion unit.

The input signals are generally classified into two kinds, i.e., level signals and pulse signals. Here, FIGS. 4A and 4B show the case that the level signal is applied, and FIGS. 4C and 4D show the case that the pulse signal is applied.

Figure 4A:
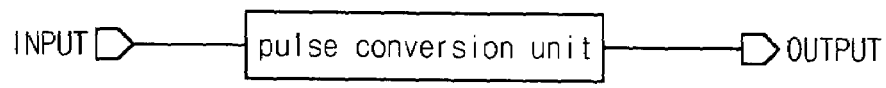
FIGS. 4A to 4D are waveform diagrams of input signals applied to a pulse conversion unit and output signals of the pulse conversion unit.
Figure 4A:
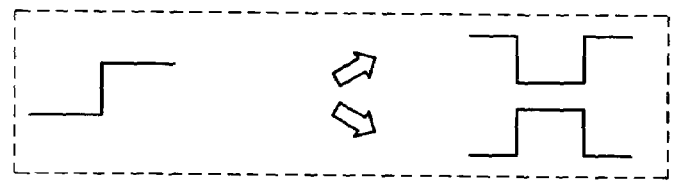

FIG. 4A illustrates a process of converting a level signal, which is transiting to a high level, into a pulse signal having a predetermined pulse width. In this case, the pulse conversion unit can output a high or low-level pulse having a predetermined pulse width in accordance with the construction of the pulse conversion unit.

Figure 4B:
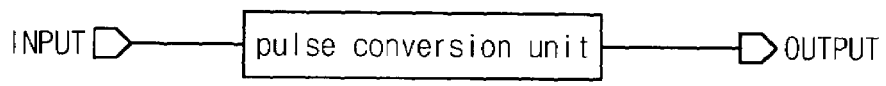
Figure 4B:
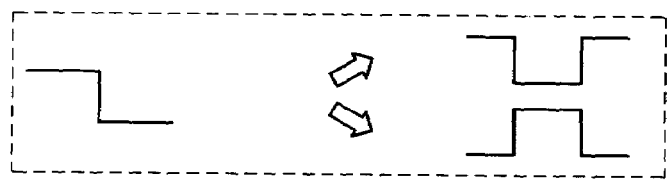

FIG. 4B illustrates a process of converting a level signal, which is transiting to a low level, into a pulse signal having a predetermined pulse width. In this case, the pulse conversion unit can output a low or high-level pulse having a predetermined pulse width in accordance with the construction of the pulse conversion unit.

Figure 4C:
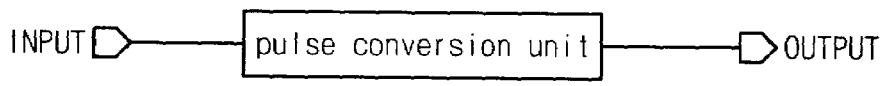
Figure 4C:
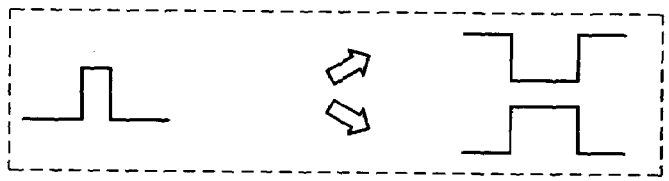
Figure 4D:
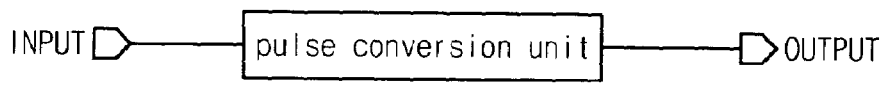
Figure 4D:
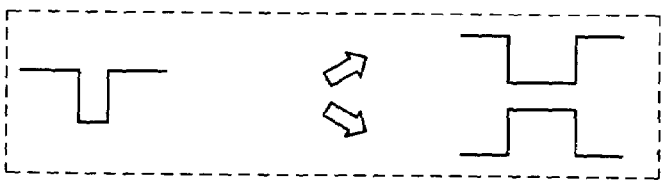

FIG. 4C illustrates a process of converting a rising pulse signal into a pulse signal having a predetermined width. Here, the pulse conversion unit modulates the pulse width of the input pulse signal to output the pulse-width-modulated pulse signal. Also, the pulse-width-modulated pulse signals may be a low or high-level pulse having a predetermined pulse width.

FIG. 4D illustrates a process of converting a falling pulse signal into a pulse signal having a predetermined width. In the same manner as in FIG. 4C, the pulse conversion unit modulates the pulse width of the input pulse signal to output the pulse-width-modulated pulse signal. Also, the pulse-width-modulated pulse signals may be a low or high-level pulse having a predetermined pulse width.

The reason why the input signal is converted into a pulse signal of a predetermined pulse width will be explained later.

Next, in FIG. 3, the shared delay unit 320 includes one delay unit 330, and this delay unit 330 receives a plurality of pulse signals PULSE 0, PULSE 1, PULSE 2 PULSE 3, and then outputs delay signal DELAY OUTPUT delayed for a predetermined time. Here, the shared delay unit 320 applies a plurality of pulse signals PULSE 0, PULSE 1, PULSE 2 and PULSE 3 to the delay signal DELAY OUTPUT outputted from the delay unit 330.

Figure 5A:
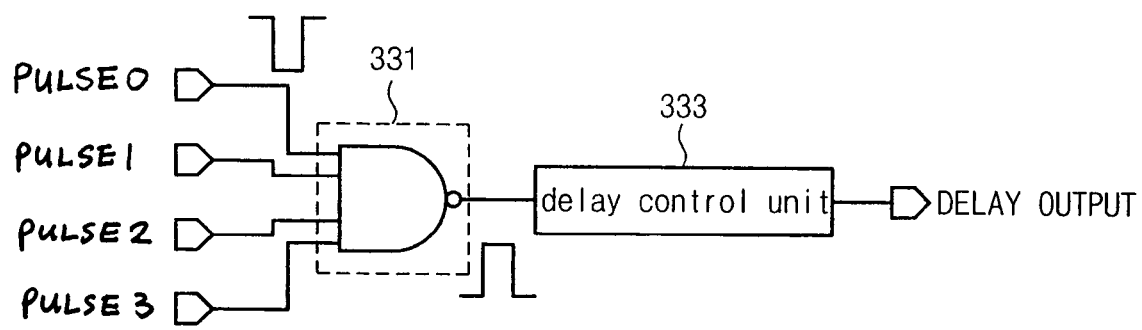
FIGS. 5A and 5B are circuit diagrams of a delay unit of FIG. 3.
Figure 5B:
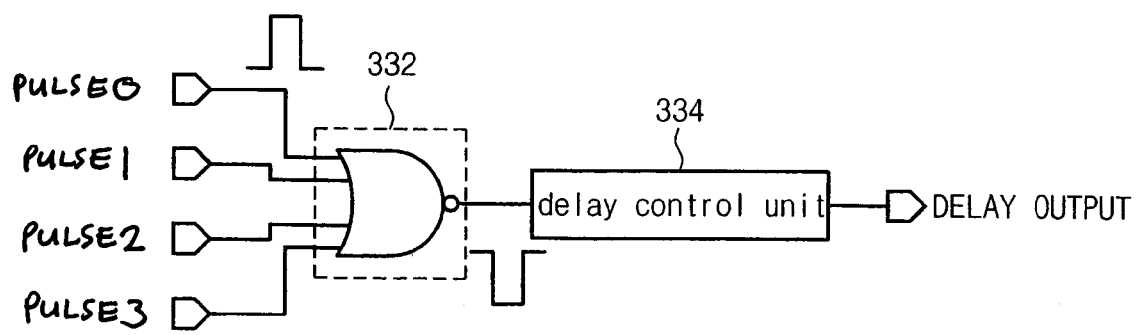

Examples of the detailed circuit construction of the delay unit 300 of FIG. 3 are illustrated in FIGS. 5A and 5B.

The delay unit 330 of FIG. 5A includes a pulse signal detection unit 331 for receiving four pulse signals PULSE 0, PULSE 1, PULSE 2 and PULSE 3, and a delay control unit 333 for receiving an output signal of the pulse signal detection unit 331. The pulse signal detection unit 331 comprises a NAND gate 331 for detecting whether one of the plurality of pulse signals is activated.

FIG. 5A is a circuit diagram illustrating an example of the delay unit which is activated if the pulse signal is a low-level pulse.

As illustrated, if one of the pulse signals is activated (e.g., if a low-level pulse signal having a predetermined pulse width is applied), the NAND gate 331 outputs a high-level pulse signal having the same pulse width. The delay control unit 333 is a circuit for time delay for a predetermined time, and can be freely implemented by a skilled person in the art. For example, a skilled person in the art will be able to adjust the time delay using a delay chain and so on. Accordingly, the output signal of the NAND gate 331 is outputted to the delay control unit 333 after the predetermined delay time. The output signal of the delay control unit 333 is indicated as "DELAY OUTPUT".

Meanwhile, the delay unit 330 of FIG. 5B includes a NOR gate 332 for receiving four pulse signals PULSE 0, PULSE 1, PULSE 2 and PULSE 3, and a delay control unit 334 for receiving an output signal of the NOR gate 332. FIG. 5B shows another example of the delay unit which is activated if the pulse signal is a high-level pulse.

As illustrated, if one of the pulse signals is activated (e.g., if a high-level pulse signal having a predetermined pulse width is applied), the NOR gate 332 outputs a low-level pulse signal having the same pulse width. The delay control unit 334 is a circuit for time delay for a predetermined time, and can be freely implemented by a skilled person in the art. In the same manner as in FIG. 5A, the output signal of the NOR gate 332 is outputted to the delay control unit 333 after the predetermined delay time. The output signal of the delay control unit 334 is indicated as "DELAY OUTPUT". As described above, the output signal of the delay control unit is a signal obtained by delaying the pulse signal for a predetermined time.

Figure 7A:
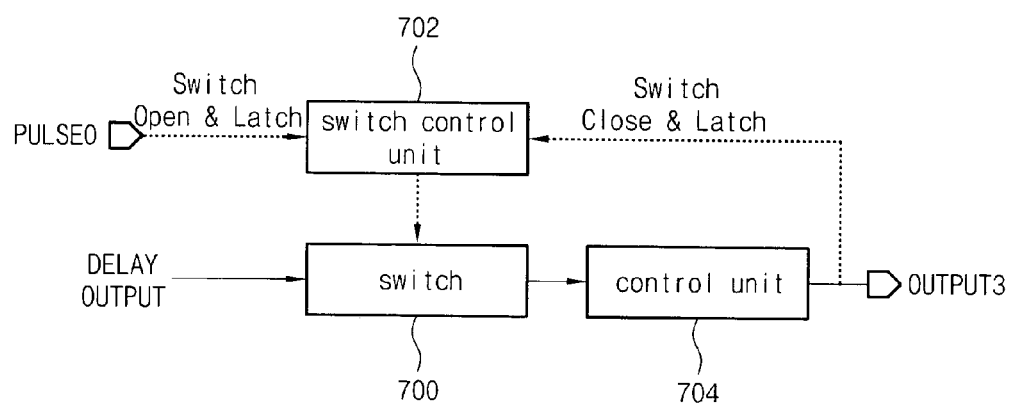
FIGS. 7A and 7B are circuit diagrams of a switch and output control unit illustrated in FIG. 6.
Figure 7B:
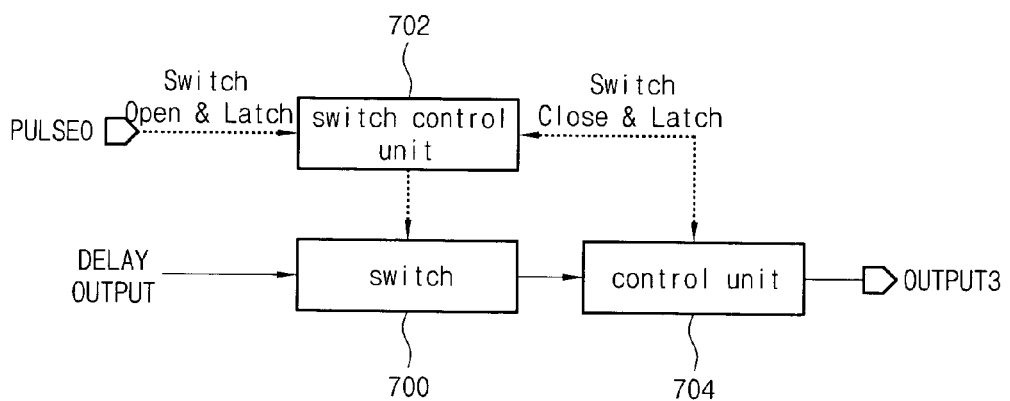

Next, in FIG. 3, the output control unit 340 receives the output signal DELAY OUTPUT of the delay unit 330 in addition to the pulse signals PULSE 0, PULSE 1, PULSE 2 and PULSE 3, and the detailed circuit construction thereof is illustrated in FIGS. 7A and 7B.

Figure 6:
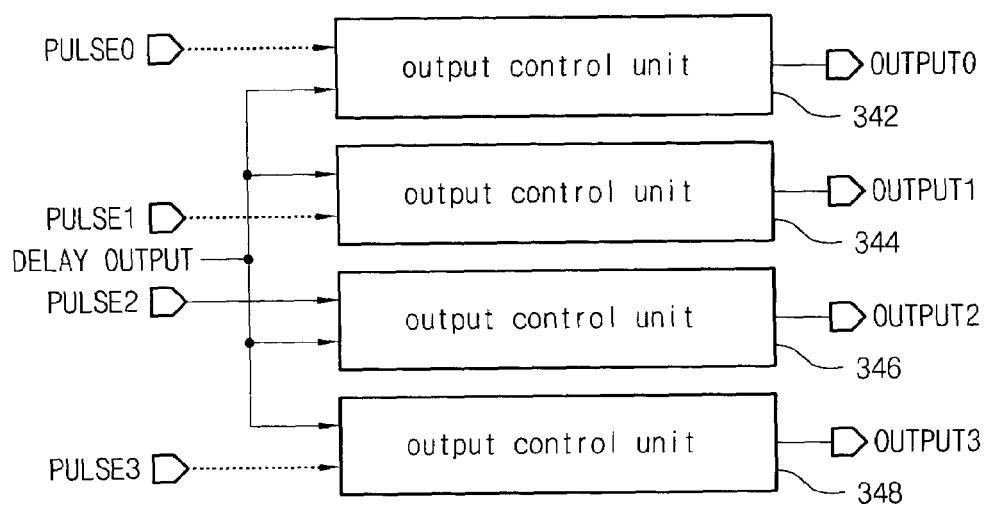
FIG. 6 is a circuit diagram of an output control unit of FIG. 3.

FIG. 6 shows the basic construction of the output control unit 340. As is illustrated in FIG. 6, the output control unit 340 includes a plurality of switch and output control units 342, 344, 346 and 348 which correspond to the pulse signals PULSE 0, PULSE 1, PULSE 2 and PULSE 3. The switch and output control units 342, 344, 346 and 348 receive the output signal DELAY OUTPUT of the delay unit 330. Output signals of the switch and output control units 342, 344, 346 and 348 are indicated as "OUTPUT 0", "OUTPUT 1", "OUTPUT 2", and "OUTPUT3". The detailed operation of the switch and output control units will be explained with reference to FIGS. 7A and 7B.

FIGS. 7A and 7B are circuit diagrams of a switch and output control unit illustrated in FIG. 6. FIG. 7A shows an automatic reset type switch and output control unit, and FIG. 7B shows a manual reset type switch and output control unit.

In FIG. 7A, the automatic reset type switch and output control unit includes a switch 700 for receiving the output signal DELAY OUTPUT of the delay unit 330, a switch control unit 702 for receiving the pulse signal (for example, PULSE 0) and turning on/off the switch 700, and a control unit 704 for receiving the signal DELAY OUTPUT transmitted through the switch 700. Hereinafter, for convenience' sake, it is assumed that the input signal is "INPUT 0".

Referring to FIGS. 3 and 7A, the pulse conversion unit 310 receives the input signal INPUT 0, and outputs the pulse signal PULSE 0. Also, the output signal DELAY OUTPUT of the delay unit 330 is a signal obtained by delaying the pulse signal PULSE 0 for a predetermined time.

In operation, if a preceding pulse signal PULSE 0 is applied to the switch control unit 702 and turns on the switch 700, the output signal DELAY OUTPUT of the delay unit 330, after the predetermined time, passes through the switch 700 and is inputted to the control unit 704. The control unit 704 determines whether to output the pulse signal or the level signal in response to the input signal DELAY OUTPUT, and determines the phase of the output signal. Accordingly, even if the input signal INPUT 0, which is either the level signal or the pulse signal, is converted into a specified pulse signal by the pulse conversion unit 310, the final signal OUTPUT0 outputted from the switch and output control unit 342 will be the input signal INPUT 0 delayed for the predetermined time. Here, the automatic reset type switch and output control unit of FIG. 7A is used in the case that the output signal of the control unit 704 is the pulse signal, and if the pulse signal is outputted from the control unit 704, it transmits a signal for closing the switch 700 to the control unit 702. In this case, the switch control unit 704 closes the switch 700, and thus the shared delay circuit enters into a standby mode until the next input signal is applied.

The manual reset type switch and output control unit of FIG. 7B is used in the case that the output signal of the control unit 704 is the high/low-level signal, and is identical to the automatic reset type switch and output control unit of FIG. 7A except that it compulsorily resets the outputs of the switch control unit 702 and the control unit 704 to a pre-charge state using an external reset signal RESET0.

Figure 8A:
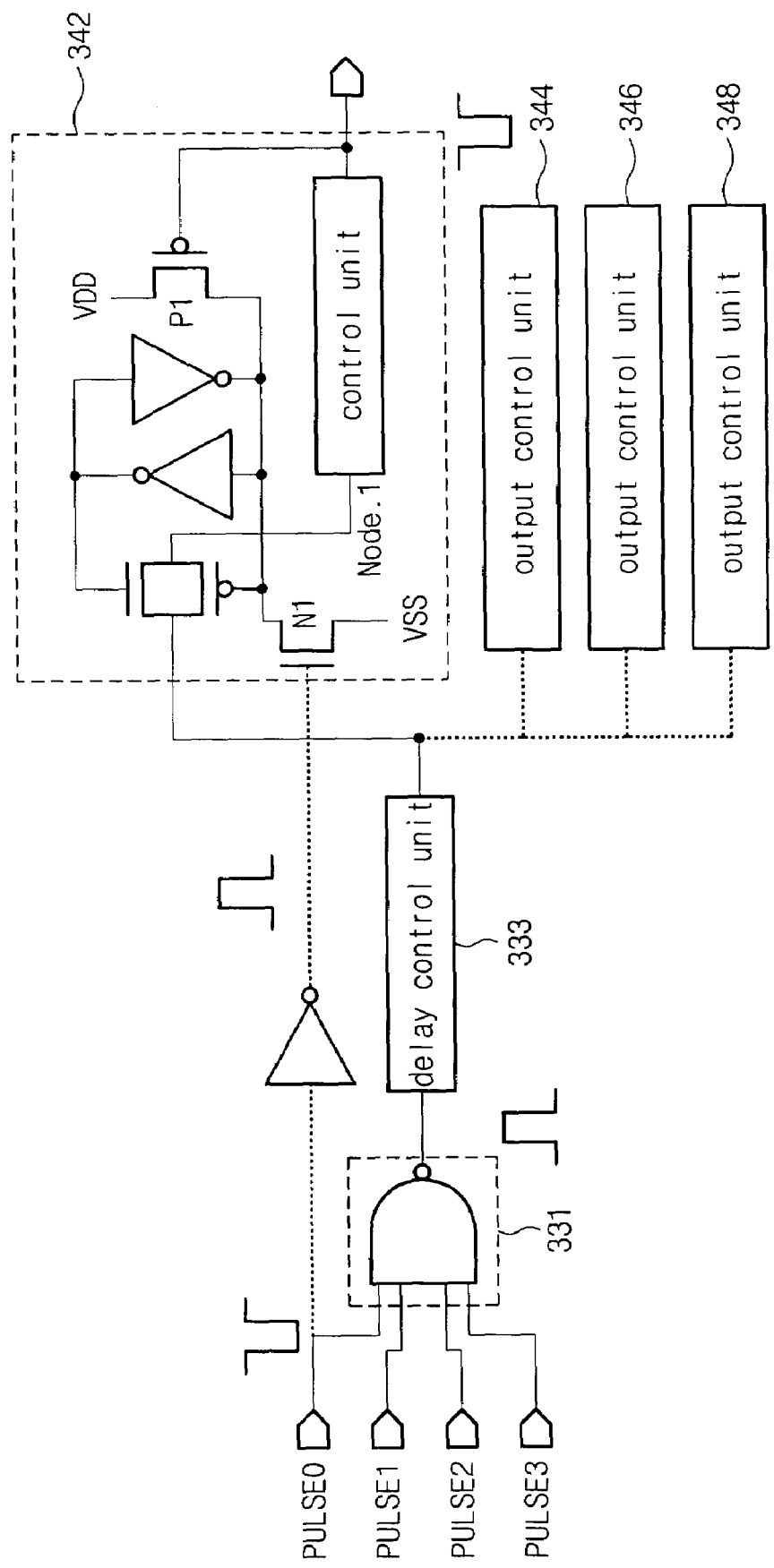
FIG. 8A is a circuit diagram explaining the operation of an automatic reset type shared delay circuit in which the final outputs of the output control units are pulse signals.

FIG. 8A is a circuit diagram explaining the operation of an automatic reset type shared delay circuit in which the final outputs of the output control units are pulse signals.

In FIG. 8A, the pulse signals PULSE 0, PULSE 1, PULSE 2 and PULSE 3 represent the pulse signals outputted from the input signal conversion unit 300 of FIG. 3. For convenience' sake, it is assumed that a pulse signal PULSE 0 of a type 1 is applied.

If the pulse signal PULSE 0 of the type 1 passes through an inverter INV1, it is converted into a pulse signal of a type 2 as illustrated in FIG. 8A. For reference, the reason why the shared delay circuit produces the pulse signal of the type 2 using the inverter INV1 is to make the pulse signal identical to the pulse signal outputted from the delay control unit 333.

Then, If the pulse signal PULSE 0 of the type 1 passes through the NAND gate 331, it is converted into the pulse signal of the type 2, and if this pulse signal passes through the delay control unit 333, it is delayed for a predetermined time. Here, the NAND gate 331 and the delay control unit 333 correspond to the delay unit 330 of FIG. 3.

In operation, the pulse signal of the type 2 outputted from the inverter INV1 turns on an NMOS transistor N1. If the NMOS transistor N1 is turned on, a transmission gate TG1 having a switching function is kept in an open state by latch circuits INV2 and INV3.

After the predetermined time, the pulse signal outputted from the delay control unit 333 is applied to the control unit 704 through the transmission gate TG1 in the open state. The control unit 704 outputs a pulse signal having a predetermined pulse width, and this pulse signal has the same waveform as the input signal INPUT 0. Accordingly, the input signal INPUT 0 is delayed for the predetermined delay time.

Then, if a PMOS transistor P1 is turned on by the pulse signal from the control unit 704, the transmission gate TG1 is kept in a closed state by the latch circuits INV2 and INV3. In this case, the switch and output control unit 342 is kept in the standby state, and waits for the next input signal applied.

For reference, in FIG. 8A, the transmission gate TG1 corresponds to the switch 700 of FIG. 7A, and the latch circuits INV2 and INV3 correspond to the switch control unit 702 of FIG. 7A. The NMOS transistor N1 is a circuit element which receives the pulse signal PULSE 0 and controls the switch control unit 702 of FIG. 7A. The PMOS transistor P1 is a circuit element which receives the output signal of the control unit 704 and controls the switch control unit 702 of FIG. 7A.

Figure 8B:
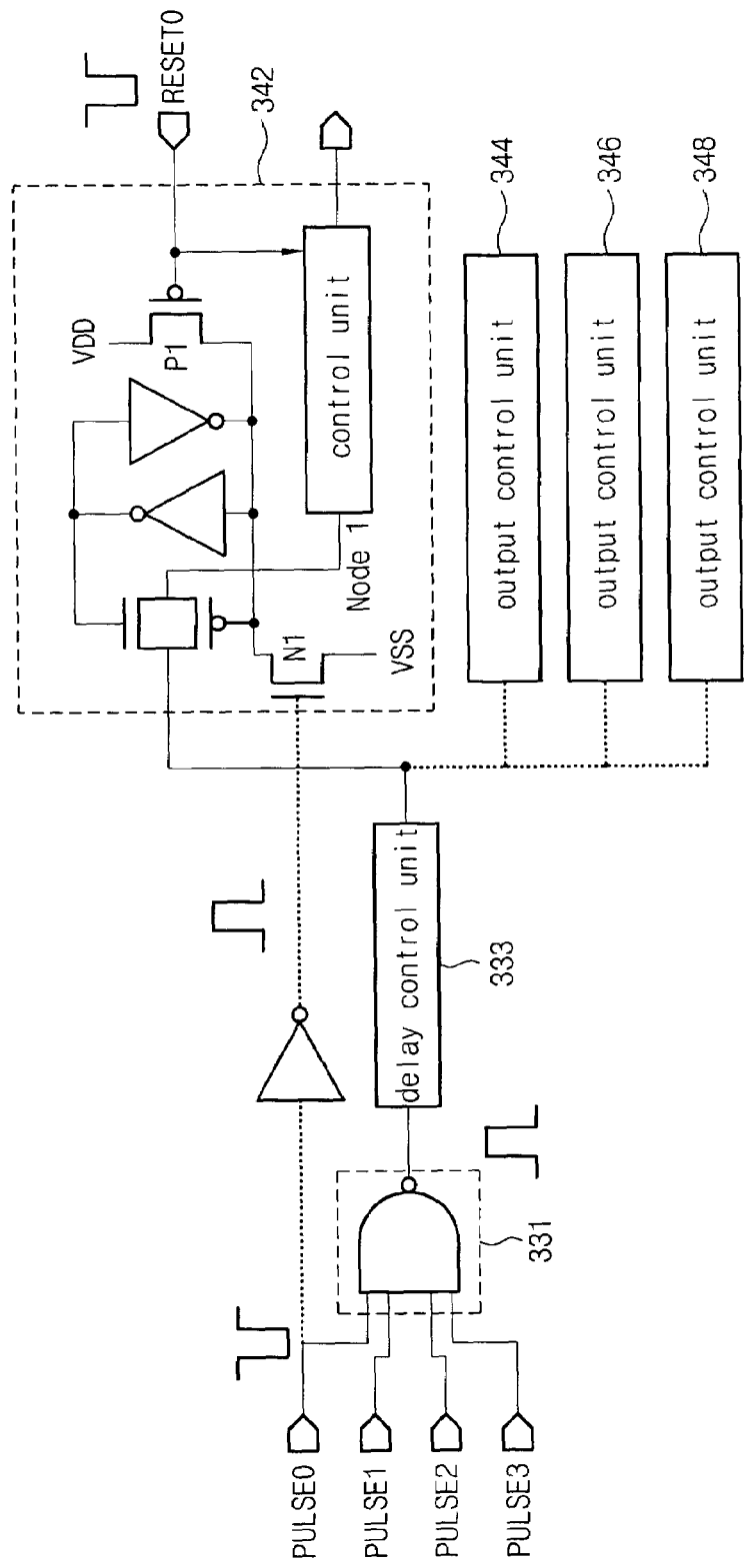
FIG. 8B is a circuit diagram explaining the operation of a manual reset type shared delay circuit in which the final outputs of the output control units are level signals.

FIG. 8B is a circuit diagram explaining the operation of a manual reset type shared delay circuit in which the final outputs of the output control units are level signals.

The circuit of FIG. 8B is used in the case that the input signal (for example, INPUT 0) is the level signal, and is identical to the circuit of FIG. 8A except that the PMOS transistor P1 and the control unit 704 are initialized by the reset signal RESET 0.

In operation, the high-level or low-level input signal INPUT 0 is delayed for the predetermined time through the shared delay circuit, and then outputted to the control unit 704. Before the reset signal RESET 0 is applied, the control unit 704 keeps the present level signal, and in this case, even if a new pulse signal PULSE 0 is applied, it is disregarded. However, the pulse signals PULSE, PULSE 2 and PULSE 3 may be applied even before the reset signal RESET 0 is applied. Here, the reset signals may be inputted for the respective circuit blocks or simultaneously inputted. If the reset signal RESET 0 is applied, the transmission gate TG1 is closed, and the output of the control unit 704 is in a pre-charge state which corresponds to a standby mode.

Figure 9:
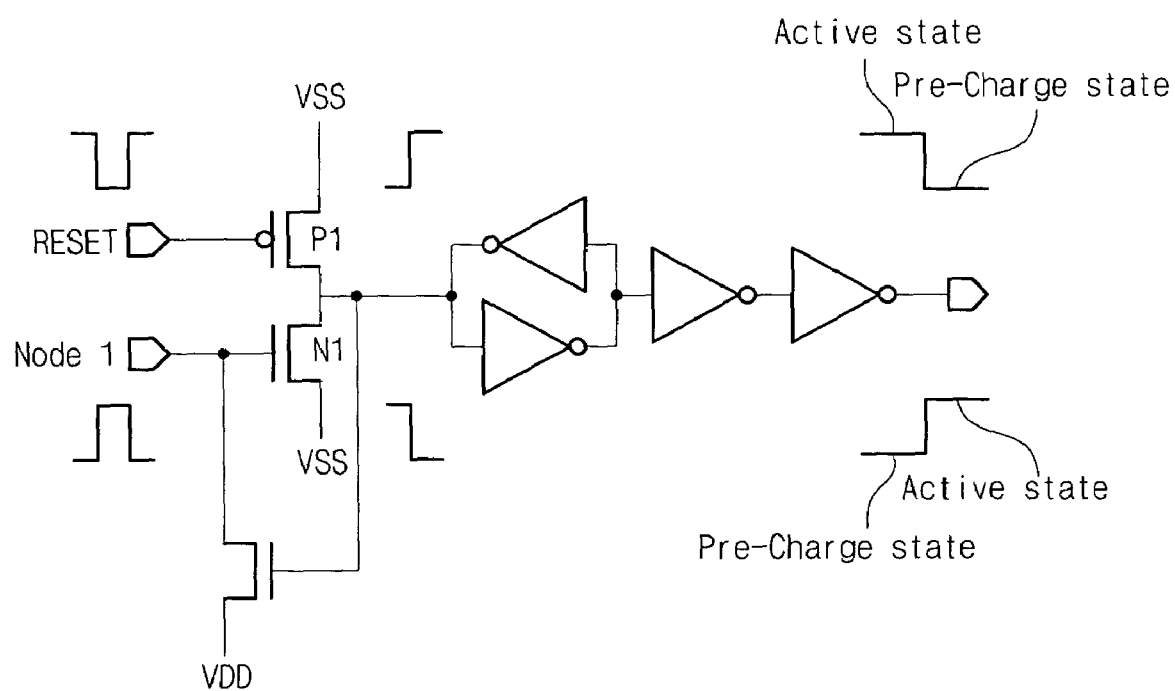
FIG. 9 is a circuit diagram of a control unit of FIG. 8B.

FIG. 9 illustrates an example of the control unit used in the circuit of FIG. 8A.

As illustrated, if the pulse signal, which has passed through the transmission gate TG1, is applied to the control unit 704, the output terminal of the control unit 704 is transited from a pre-charge state to an active state, and is continuously kept in an active state by the latch circuit before the reset signal is applied. Accordingly, the input signal, which is the level signal, is outputted after the predetermined time.

Consequently, the operation of the shared delay circuit according to the present invention as described above can be summarized as follows:

1) It uses one common delay circuit for delaying the input signals INPUT 0, INPUT 1, INPUT 2 and INPUT 3.

2) It does not matter whether the type of the input signals is the pulse signal or the level signal.

3) It converts the input signals into a specified signal form in order to use the shared delay circuit. That is, it converts the input signals into the pulse signals PULSE 0, PULSE 1, PULSE 2 and PULSE 3.

4) It transmits the pulse signals PULSE 0, PULSE 1, PULSE 2 and PULSE 3 and the delayed pulse signals, which are delayed for a predetermined time, to the switch and output control unit.

5) It keeps the switch 700 in an open state with respect to the pulse signals not delayed by controlling the switch control unit (e.g., 702 in FIG. 7) of the switch and output control unit.

6) Thereafter, it transmits the pulse signals, which were delayed for a predetermined time through the delay unit, to the control unit 704 through the switch 700.

7) The control unit 704 converts the input pulse signals into level or pulse signals having the same form as the input signals.

8) The output signal of the control unit 704 is applied to the corresponding circuit block.

9) As described above, the input signals are converted into the original form after the predetermined time, and applied to the circuit blocks.

In the present invention, the delay unit 330 is designed so that its delay time does not exceed the minimum delay between the input signals (i.e., an interval between the present input signal and the following input signal).

As described above, the shared delay circuit according to the present invention can avoid the repeated arrangement of circuits having the same function by sharing delay circuits in the semiconductor device and thus reduce the installation area of the delay circuits. Also, since the shared delay circuit according to the present invention can eliminate the delay differences due to the change of process, voltage and temperature produced when the delay circuits having the same function are arranged in different locations, the semiconductor device can stably operate.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A shared delay circuit of a semiconductor device comprising:
   an input signal conversion unit for converting a plurality of input signals into a plurality of pulse signals;
   a delay unit for detecting a predetermined signal level of any one of the plurality of pulse signals and outputting a delayed pulse signal that is formed by a plurality of the detected pulses delayed for a predetermined time; and
   a switch and output control unit for receiving the plurality of pulse signals and the delayed pulse signal delayed for the predetermined time through the delay unit, and outputting a plurality of delayed output signals,
   wherein each of the plurality of delayed output signals is in the substantially same signal form as the corresponding one of the plurality of input signals inputted into the input signal conversion unit.

2. The shared delay circuit of claim 1, wherein the input signal conversion unit has a plurality of pulse conversion units, each of which corresponds to each of the plurality of input signals.

3. The shared delay circuit of claim 1, wherein the plurality of input signals are level signals or pulse signals.

4. The shared delay circuit of claim 1, wherein the delay unit comprises:
   a pulse signal detection unit for detecting whether any one of the plurality of pulse signals exceeds the predetermined signal level and outputting the detected pulse ; and
   a delay control unit for receiving the detected pulse and delaying the detected pulse for a predetermined time, and outputting series of the detected pulses as the delayed pulse signal.

5. The shared delay circuit of claim 4, wherein the pulse signal detection unit is a NAND gate or a NOR gate.

6. The shared delay circuit of claim 1,
   wherein the switch and output control unit comprises a plurality of switches and output control units which correspond to the plurality of pulse signals; and
   wherein the switch and output control units are activated by the plurality of pulse signals and the delayed pulse signal outputted from the delay control unit, and converts the plurality of pulse signals into the plurality of delayed output signals having a delay.

7. The shared delay circuit of claim 1,
   wherein the switch and output control unit comprises a plurality of switch and output control units which correspond to the plurality of pulse signals, and each of the switch and output control unit comprises a switch, a switch control unit and a control unit; and
   wherein the switch control unit controls an on/off operation of the switch, the switch passes therethrough and applies the delayed pulse signal to the control unit, and the control unit converts the input delayed pulse signal into the input signal form.

8. The shared delay circuit of claim 7, wherein the switch control unit enters into a standby mode by an output signal of the control unit.

9. The shared delay circuit of claim 7, wherein after the output signal is outputted from the control unit, the switch control unit and the control unit compulsorily enter into a standby mode by an external signal.

* * * * *